United States Patent
Smith et al.

(10) Patent No.: US 9,590,118 B1
(45) Date of Patent: Mar. 7, 2017

(54) WAFER WITH SOI STRUCTURE HAVING A BURIED INSULATING MULTILAYER STRUCTURE AND SEMICONDUCTOR DEVICE STRUCTURE

(71) Applicant: GLOBALFOUNDRIES Inc., Grand Cayman (KY)

(72) Inventors: Elliot John Smith, Dresden (DE); Sven Beyer, Dresden (DE); Nigel Chan, Dresden (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/853,146

(22) Filed: Sep. 14, 2015

(51) Int. Cl.
| | |
|---|---|
| *H01L 29/76* | (2006.01) |
| *H01L 29/792* | (2006.01) |
| *H01L 29/66* | (2006.01) |
| *H01L 29/06* | (2006.01) |
| *H01L 29/08* | (2006.01) |
| *H01L 29/423* | (2006.01) |
| *H01L 21/762* | (2006.01) |
| *H01L 21/326* | (2006.01) |

(52) U.S. Cl.
CPC ........ *H01L 29/7923* (2013.01); *H01L 21/326* (2013.01); *H01L 21/76254* (2013.01); *H01L 29/0649* (2013.01); *H01L 29/0847* (2013.01); *H01L 29/42364* (2013.01); *H01L 29/665* (2013.01); *H01L 29/66833* (2013.01)

(58) Field of Classification Search
USPC .......................................................... 257/324
See application file for complete search history.

(56) References Cited

U.S. PATENT DOCUMENTS

| | | | | |
|---|---|---|---|---|
| 6,380,046 B1* | 4/2002 | Yamazaki | ......... | H01L 21/76254 257/E21.568 |
| 6,531,754 B1* | 3/2003 | Nagano | ............. | H01L 21/76264 257/349 |
| 7,875,532 B2* | 1/2011 | Kakehata | .......... | H01L 21/76254 257/E21.122 |
| 2003/0207545 A1* | 11/2003 | Yasukawa | ......... | H01L 21/76254 438/459 |
| 2005/0269642 A1* | 12/2005 | Minami | ............... | H01L 27/0255 257/355 |
| 2008/0036002 A1* | 2/2008 | Kishiro | ............... | H01L 27/0288 257/350 |
| 2008/0237695 A1* | 10/2008 | Shino | ..................... | G11C 11/404 257/324 |

(Continued)

*Primary Examiner* — Andy Huynh
*Assistant Examiner* — Sitaramarao S Yechuri
(74) *Attorney, Agent, or Firm* — Amerson Law Firm, PLLC

(57) ABSTRACT

The present disclosure provides, in a first aspect, a semiconductor device structure, including an SOI substrate comprising a semiconductor base substrate, a buried insulating structure formed on the semiconductor base substrate and a semiconductor film formed on the buried insulating structure, wherein the buried insulating structure comprises a multilayer stack having a nitride layer interposed between two oxide layers. The semiconductor device structure further includes a semiconductor device formed in and above an active region of the SOI substrate, and a back bias contact which is electrically connected to the semiconductor base substrate below the semiconductor device.

15 Claims, 11 Drawing Sheets

(56) References Cited

U.S. PATENT DOCUMENTS

| | | | |
|---|---|---|---|
| 2011/0012200 A1* | 1/2011 | Allibert | H01L 29/32 257/347 |
| 2013/0334603 A1* | 12/2013 | Cheng | H01L 21/76232 257/347 |
| 2015/0093861 A1* | 4/2015 | Loubet | H01L 21/84 438/154 |

* cited by examiner

WAFER WITH SOI STRUCTURE HAVING A BURIED INSULATING MULTILAYER STRUCTURE AND SEMICONDUCTOR DEVICE STRUCTURE

BACKGROUND OF THE INVENTION

1. Field of the Invention

The present disclosure generally relates to semiconductor device structures formed in and above SOI (semiconductor-on-insulator) substrates having a buried insulating multilayer structure and to the fabrication of a wafer with an SOI structure having a buried insulating multilayer structure, and, particularly, to flash non-volatile floating back bias in such SOI semiconductor devices.

2. Description of the Related Art

In the technology of computer data storage, storage or memory devices are generally distinguished by non-volatile memory and volatile memory devices. Volatile memory devices, as opposed to non-volatile memory devices, require constant power to maintain the stored information and are often implemented in the form of dynamic random access memory (DRAM) or static random access memory (SRAM) devices. In contrast, non-volatile memory devices retain the stored information even when not constantly supplied with electric power. Accordingly, non-volatile memory devices are suitable for long-term storage of information. An example of an electronic non-volatile computer storage medium is given by flash memory, which was originally developed from electrically erasable programmable read only memory (EEPROM). In a more recent application, flash memories are used as a replacement for hard discs. Since flash memory does not have the mechanical limitations and latencies of hard drives, so-called "solid state drives (SSDs)" are attractive when considering speed, noise, power consumption and reliability relative to traditional hard drives. Accordingly, flash drives are gaining in popularity as mobile device secondary storage devices and as substitutes for hard drives in high performance desktop computers.

Recent approaches to non-volatile computer memory are closely related to flash RAM, i.e., in the form of silicon-oxide-nitride-oxide-silicon (SONOS) structures, representing one of a charge trap flash variant. SONOS structures promise lower programming voltages and higher program/erase cycle endurance when compared to polysilicon-based flash devices. Currently, SONOS is an area of active research and development effort.

A SONOS memory device generally uses a silicon nitride layer with traps as a charge storage layer. The traps in the charge storage layer (silicon nitride) capture charge carriers injected from a channel of a MOS transistor and retain the charge. Therefore, this type of memory is also known as a so-called "charge trap memory." Since the charge storage layer (silicon nitride) is an insulator, this storage mechanism is inherently less sensitive to pinhole defects and is more robust in terms of yield and data retention. Since a SONOS transistor shares many of the key process steps implemented in current CMOS transistors, many regions of a SONOS transistor, i.e., source, drain and gate, are identical to those of a common CMOS transistor. Consequently, the process architecture of embedded SONOS technologies is given by the known process architecture of CMOS technology.

Currently, non-volatile and reconfigurable field programmable gate arrays (FPGAs) are considered as representing an attractive solution for high level system integration in various applications, such as aerospace and military applications. Unlike SRAM-based FPGAs, the configuration memories are not volatile and, hence, do not require additional non-volatile memory to reload the device configuration data at system power-up or due to radiation effects in addition to triple module redundancy (TMR) of its entire set of configuration bits.

With the continuous scaling down of device dimensions to increasingly small technology nodes at 28 nm and beyond, various issues and challenges arise. For example, precise control of the electrical conductivity of the channel of a MOS transistor is difficult to maintain at very small process geometries. Since the switching behavior of a MOSFET is characterized by the threshold voltage (Vt) of a MOSFET, the precise setting of a definition and control of the threshold voltage (Vt) throughout the fabrication process of semiconductor devices is essential for achieving optimal power consumption and performance of semiconductor device structures. In general, there are several factors which control the threshold voltage (Vt), such as the gate oxide thickness, the work function of the gate, and the channel doping, mainly representing independent factors. The scaling of a semiconductor device to more advanced technology nodes led to faster switching and higher current drive behaviors or advanced semiconductor devices, at the expense, however, of a decreased noise margin, increased leakage current and increased power.

It is, therefore, desirable to control the threshold voltage (Vt) of advanced semiconductor devices at advanced technology nodes, and to provide semiconductor device structures that allow for adjustment and tuning of the threshold voltage (Vt), particularly in flash memory technologies.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In a first aspect of the present disclosure, a semiconductor device structure is provided. In accordance with some illustrative embodiments herein, the semiconductor device structure includes an SOI (semiconductor-on-insulator) substrate comprising a semiconductor base substrate, a buried insulating structure formed on the semiconductor base substrate and a semiconductor film formed on the buried insulating structure, wherein the buried insulating structure comprises a multilayer stack having a nitride layer interposed between two silicon dioxide layers. The semiconductor device structure further includes a semiconductor device formed in and above an active region of the SOI substrate, and a back bias contact which is electrically connected to the semiconductor base substrate below the semiconductor device.

In a second aspect of the present disclosure, a method of forming a wafer with an SOI structure having a buried insulating multilayer structure is provided. In accordance with some illustrative embodiments herein, the method includes providing a first wafer comprising a first semiconductor material, the first wafer having a first layer of a silicon dioxide material formed on an upper surface of the semiconductor material, implanting hydrogen ions into the first semiconductor material close to the upper surface of the semiconductor material for forming a hydrogen layer region in the first semiconductor material, providing a second wafer comprising a second semiconductor material, the second wafer having a second layer of a silicon dioxide material formed on an upper surface of the second semiconductor material and a third layer of a nitride material disposed on the second layer, bonding one of an upper surface of the first layer and an upper surface of the third layer to the other one of the upper surface of the first layer and the upper surface of the third layer, performing a heat treatment process for inducing a breaking of the first semiconductor material at the hydrogen layer region resulting in a broken first semiconductor material and a broken bonded wafer structure, removing the broken first semiconductor material, leaving the broken bonded wafer structure, and polishing an exposed surface of the first semiconductor material of the broken wafer structure to form a fourth layer of the first semiconductor material formed on the first layer, resulting in the wafer with SOI structure having a buried insulating multilayer structure.

In a third aspect of the present disclosure, a method of forming a semiconductor device structure is provided. In accordance with some illustrative embodiments herein, the method includes providing a wafer with an SOI structure having a buried insulating multilayer structure interposed between an active semiconductor layer and the base substrate material, forming a gate structure above the active semiconductor layer, forming raised source/drain regions at opposing sides of the gate structure, and forming a back bias contact structure for contacting the base substrate material below the gate structure, wherein the back bias contact structure is electrically insulated from the active semiconductor layer.

BRIEF DESCRIPTION OF THE DRAWINGS

The disclosure may be understood by reference to the following description taken in conjunction with the accompanying drawings, in which like reference numerals identify like elements, and in which.

Figure 1:
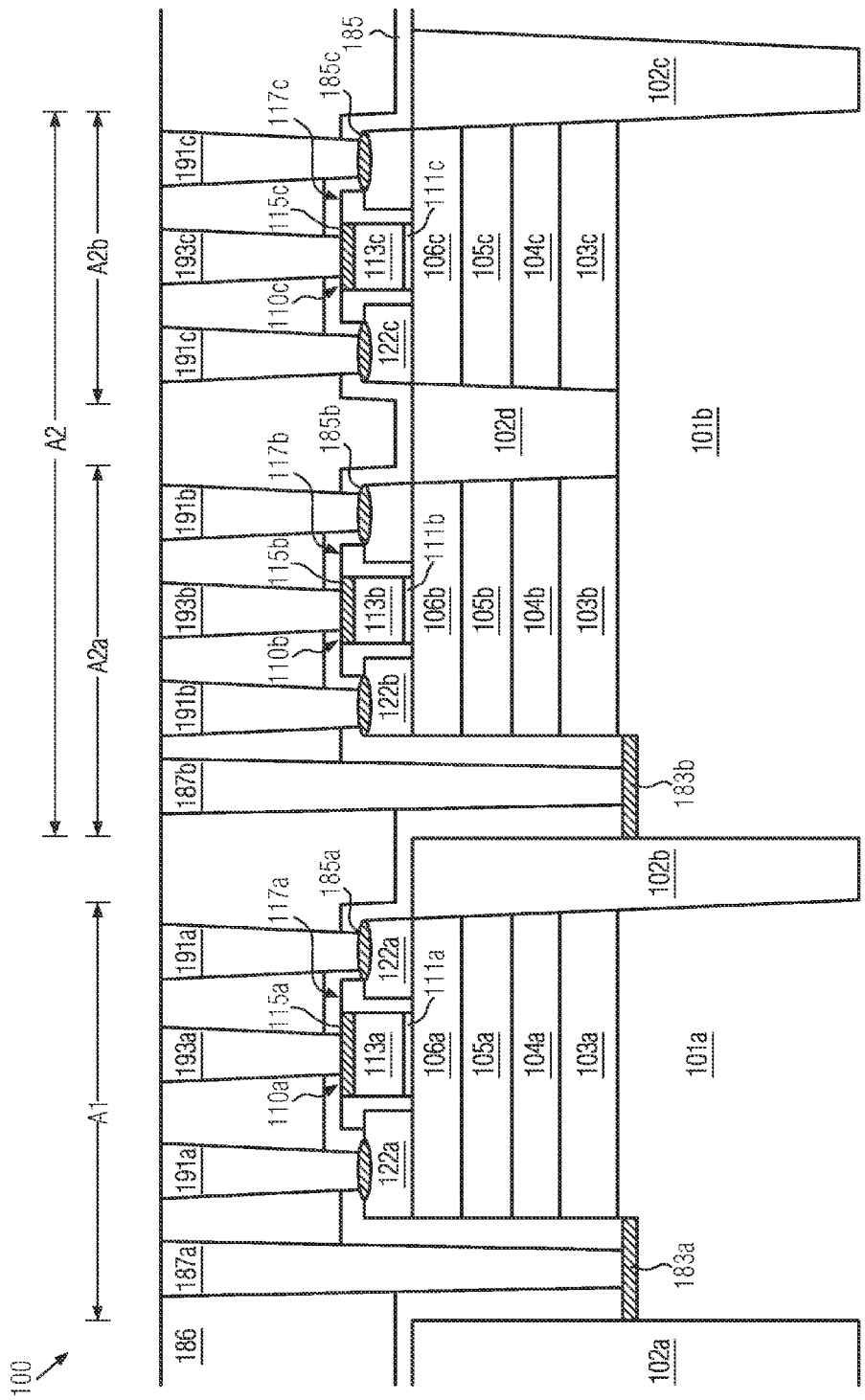
FIG. 1 schematically illustrates a semiconductor device structure in accordance with some illustrative embodiments of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure relates to a method of forming a semiconductor device and to semiconductor devices, wherein the semiconductor devices are integrated on or in a chip. In accordance with some illustrative embodiments of the present disclosure, the semiconductor devices may substantially represent FETs, e.g., MOSFETs or MOS devices. When referring to MOS devices, the person skilled in the art will appreciate that, although the expression "MOS device" is used, no limitation to a metal-containing gate material and/or to an oxide-containing gate dielectric material is intended.

In one example, semiconductor devices of the present disclosure may be related to devices which may be fabricated by using advanced technologies, i.e., the semiconductor devices may be fabricated by technologies applied to approach technology nodes smaller than 100 nm, for example, smaller than 50 nm or smaller than 35 nm, e.g., at 28 nm or below. After a complete review of the present application, the person skilled in the art will appreciate that, according to the present disclosure, ground rules smaller or equal to 45 nm, e.g., at 28 nm or below, may be imposed, but the present invention is not limited to such examples. After a complete review of the present application, the person skilled in the art will also appreciate that the present disclosure may, in one embodiment, be employed in fabricating semiconductor devices with structures of minimal length dimensions and/or width dimensions smaller than 100 nm, for example, smaller than 50 nm or smaller than 35 nm or smaller than 28 nm. For example, the present disclosure may provide semiconductor devices fabricated by using 45 nm technologies or below, e.g., 28 nm or even below.

After a complete reading of the present application, a person skilled in the art will appreciate that semiconductor devices disclosed herein may be fabricated as P-channel MOS transistors or PMOS transistors and N-channel transistors or NMOS transistors; and that both types of transistors may be fabricated with or without mobility-enhancing stressor features or strain-inducing features. It is noted that a circuit designer can mix and match device types, using PMOS and NMOS devices, stressed and unstressed, to take advantage of the best characteristics of each device type as they best suit the semiconductor device under design.

In general, SOI (semiconductor-on-insulator) devices have an active semiconductor layer disposed on a buried insulating material layer, which, in turn, is formed on a base substrate material. In accordance with some illustrative embodiments herein, the active semiconductor layer may comprise one of silicon, germanium, silicon-germanium and the like. The buried insulating material layer may comprise an insulating material, e.g., silicon dioxide or silicon nitride. The base substrate material may be a base material that may be used as a substrate as known in the art, e.g., silicon and the like. After a complete review of the present application, the person skilled in the art will appreciate that, in accordance with illustrative embodiments employing FDSOI substrates, the active semiconductor layer may have a thickness of about 20 nm or less, while the buried insulating material layer may have a thickness of about 145 nm or, in accordance with advanced techniques, the buried insulating material layer may have a thickness in a range from about 10-30 nm. For example, in some special illustrative embodiments of the present disclosure, the active semiconductor layer may have a thickness of about 6-10 nm.

As to a crystallographic plane orientation of the base substrate material, similar to that of an ordinary silicon device, an SOI substrate whose surface is a face (100) may be used. However, in order to improve the performance of a PMOS semiconductor device, an SOI substrate whose surface is a face (110) may be used to fabricate a PMOS device. Alternatively, a hybrid plane orientation substrate whose surface may be mixed by a face (100) and a face (110) may be used. With regard to a varactor device, there is no restriction on a crystal plane orientation such that an impurity concentration, film thickness, dimension ratio of the device and the like can be appropriately adjusted to obtain a capacitance characteristic that is suitable according to the plane orientation set by other requirements. In alternative embodiments, the base substrate material may be of an N-type when N-accumulation and/or N-inversion devices are considered (otherwise P-type for P-accumulation and/or P-inversion).

FIG. 1 schematically illustrates a semiconductor device structure 100 in accordance with some illustrative embodiments of the present disclosure. The semiconductor device structure 100 comprises a wafer of an SOI (semiconductor-on-insulator) type comprising a base substrate material 101, a buried insulating multilayer structure and an active semiconductor layer formed on the buried insulating multilayer structure. In accordance with some special illustrative embodiments of the present disclosure, the buried insulating multilayer structure is formed by an oxide-nitride-oxide (ONO) multilayer stack with a nitride layer being interposed between silicon dioxide layers. In accordance with a non-limiting example, the nitride layer may be formed by $Si_3N_4$ interposed between two silicon dioxide material layers.

As illustrated in FIG. 1, the accordingly provided SOI structure may have an isolation structure, such as a plurality of insulating elements 102a, 102b and 102c, formed in an upper surface of the base substrate material 101 to thereby separate at least two regions 101a and 101b of the base substrate material 101 in an upper surface region thereof. On each of the regions 101a and 101b, at least one semiconductor device is formed.

In accordance with some illustrative embodiments, as illustrated in FIG. 1, a buried insulating multilayer structure may be formed above the region 101a and the region 101a may be enclosed by the isolation elements 102a and 102b. The buried insulating multilayer structure above the region 101a may comprise a first layer 103a of a first insulating material, a second layer 104a of a second insulating material, and a third layer 105a of a third insulating material. In accordance with some illustrative examples herein, the second insulating material 104a may be a nitride material, e.g., $Si_3N_4$, and the first and third insulating materials 103a, 105a may be provided by a silicon dioxide material. For example, the first layer 103a, second layer 104a and third layer 105a may provide an ONO-structure, wherein the second layer 104a represents a charge-trapping layer.

On the buried insulating multilayer structure as provided by the first to three layers 103a to 105a, an active semiconductor layer 106a may be formed. In accordance with some illustrative examples, the active semiconductor layer 106a may be formed by a silicon material, e.g., silicon, silicon germanium and the like. Consequently, an active region of an SOI type is formed by the region 101a of the base substrate material 101, the buried insulating multilayer structure 103a to 105a and the active semiconductor layer 106a being enclosed by the isolation elements 102a and 102b. In the first active region A1, a semiconductor device comprising a gate structure 110a and raised source/drain regions 122a disposed at opposing sides of the gate structure 110a may be formed above the active semiconductor layer 106a.

In accordance with illustrative embodiments of the present disclosure, the gate structure 110a may be formed by a gate dielectric structure 111a, e.g., comprising a silicon oxide material and/or a high-k material, such as a hafnium oxide material, and possibly one or more work function adjusting material, e.g., TiN and the like, a gate electrode material 113a, and a gate silicide region 115a being in contact with a gate contact 193a. A separation between the gate structure 110a and raised source/drain regions 122a may be adjusted by a sidewall spacer structure 117a formed on sidewalls of the gate electrode material 113a and the gate dielectric structure 111a. Furthermore, the sidewall spacer structure 117a may adjust a distance between the gate structure 110a and silicide regions 185a formed on the raised source/drain regions 122a, the silicide regions 185a being in contact with source/drain contacts 191a.

In accordance with some illustrative embodiments of the present disclosure, a back bias contact structure contacting the region 101a for applying a back bias to the region 101a may be formed adjacent to the semiconductor device in the first active region A1. The back bias contact structure may be formed by a back bias contact 187a and a back bias silicide region 183a provided in the region 101a. This does not pose any limitation to the present disclosure and, in accordance with some alternative embodiments of the present disclosure, the back bias silicide region 183a may be omitted, in which case a higher ohmic resistance is provided between the back bias contact 187a and the region 101a (upon applying a static voltage as a back bias, the higher ohmic resistance may be acceptable).

Adjacent to the first active region A1, a second active region A2 may be provided, the second active region A2 being enclosed by insulating elements 102b and 102c. The second active region A2 may have a back bias contact structure comprising a back bias contact 187b electrically connected to a back bias silicide region 183b formed in an upper surface of the region 101b.

In accordance with some illustrative embodiments of the present disclosure, two semiconductor devices comprising gate structures 110b and 110c may be provided above the region 101b. This does not pose any limitation to the present disclosure and, instead, any other number of semiconductor devices may be formed in and above the second active region A2 (e.g., a single semiconductor device, three semiconductor devices, etc.). The semiconductor devices may be separated by a shallow trench isolation (STI) element 102d that separates the active semiconductor layer and the buried insulating multilayer structure provided above the region 101b in the second active region A2 into two active semiconductor layers 106b and 106c disposed on buried insulating multilayers 103b, 104b and 105b in a first sub-region A2a of the second active region A2, and a buried insulating multilayer structure 103c, 104c and 105c in a second sub-region A2b of the second active region A2.

In accordance with some illustrative embodiments of the present disclosure, a back bias applied to the region 101b via the back bias contact 187b may be simultaneously applied to each of the semiconductor devices provided by the gate structures 110b and 110c in the second active region A2. In contrast, a back bias applied by the back bias contact 187a may be only supplied to the region 101a. The person skilled in the art will appreciate that, depending on a depth of the insulating elements 102a, 102b and 102c reaching into the base substrate material 101, a back bias applied to one of the back bias contacts 187a and 187b may be confined to the respective one of the regions 101a and 101b. Accordingly, each of the regions 101a and 101b may be back-biased independent of a possible back bias in the other one of the regions 101a and 101b.

As illustrated in FIG. 1, a semiconductor device formed by the gate structure 110b may further comprise a gate dielectric structure 111b, e.g., comprising a silicon dioxide material and/or a high-k material, such as a hafnium oxide material, and possibly one or more work function adjusting materials, e.g., TiN and the like, a gate electrode material 113b, and a gate silicide region 115b being in contact with a gate contact 193b. A separation between the gate structure 110b and raised source/drain regions 122b formed at opposing sides of the gate structure 110b may be adjusted by a sidewall spacer structure 117b formed on sidewalls of the gate electrode material 113b and the gate dielectric structure 111b. Furthermore, the sidewall spacer structure 117b may adjust a distance between the gate structure 110b and silicide regions 185b formed on the raised source/drain regions 122b, the silicide regions 185b being in contact with source/drain contacts 191b.

As illustrated in FIG. 1, a semiconductor device formed by the gate structure 110c may further comprise a gate dielectric structure 111c, e.g., comprising a silicon dioxide material and/or a high-k material, such as a hafnium oxide material, and possibly one or more work function adjusting materials, e.g., TiN and the like, a gate electrode material 113c, and a gate silicide region 115c being in contact with a gate contact 193c. A separation between the gate structure 110c and raised source/drain regions 122c formed at opposing sides of the gate structure 110c may be adjusted by a sidewall spacer structure 117c formed on sidewalls of the gate electrode material 113c and the gate dielectric structure 111c. Furthermore, the sidewall spacer structure 117c may adjust a distance between the gate structure 110c and silicide regions 185c formed on the raised source/drain regions 122c, the silicide regions 185c being in contact with source/drain contacts 191c.

In accordance with some illustrative embodiments of the present disclosure, the contacts 187a, 191a and 193a (together with the respective contacts in the second active region A2) may be embedded into a contact dielectric 186, e.g., a low-k material. Furthermore, a TPEN or CPEN material 185 may be deposited by chemical vapor deposition (CVD) methods to impose tensile or compressive strain on the semiconductor device structure 100 and to electrically insulate the back bias contacts 187a and 187b from the active semiconductor layers 106a and 106b.

In accordance with some illustrative embodiments of the present disclosure, each of the second layers 104a, 104b and 104c may function as a charge storage material layer. That is, the second layers 104a, 104b and 104c, although being non-conductive layers, may contain a large number of charge-trapping sites which are able to hold an electrostatic charge by trapping charge carriers, such as electrons and/or defect electrons, at trapping centers present in the second layers 104a to 104c. For example, upon applying a positive bias to the back bias contact 187a and/or the back bias contact 187b, electrons injected into the active semiconductor layer 106a and/or 106b and/or 106c may tunnel through the third layer 105a and/or 105b and/or 105c and may be trapped in the second layer 104a and/or 104b and/or 104c. Furthermore, trapped electrons may be removed by application of an appropriate negative bias to the back bias contact 187a and/or 187b. After a complete reading of the present application, a person skilled in the art will understand that, via a back bias, the threshold voltage (Vt) of the semiconductor device in the first active region A1 (or alternatively more than one, in case more than one gate structure is provided in the first active region A1) and/or of at least one of the semiconductor devices in the second active region A2 may be tuned and/or be subjected to a stable shift upon applying a sufficient back bias flash to the back bias contact 187a and/or 187b. Accordingly, a single semiconductor device or plural semiconductor devices, e.g., large blocks of transistors, may be flashed to a different threshold voltage (Vt) in a non-volatile manner.

In accordance with some illustrative embodiments, at least one of the third layers 105a to 105c may be a silicon dioxide layer, such as a pure oxide layer (e.g., pure silicon dioxide material), or by a nitridized silicon dioxide layer having a particular nitrogen concentration profile reduce the equivalent oxide thickness relative to a pure silicon dioxide layer while retaining a low interface trap density. After a complete reading of the present application, a person skilled in the art will appreciate that, in forming at least one of the third layers 105a to 105c with a reduced thickness, tunneling characteristics for charge carries tunneling from respective channel regions through the accordingly formed third layer(s) may be improved and voltage levels to be applied for flashing and/or tuning threshold voltages (Vt) may be reduced. The voltage levels for programming and/or erasing ONO structures in SOI substrates (via trapped charges) may be adjusted by accordingly implementing the ONO structure. In one particular embodiment, a nitridized third layer having a thickness in a range of about 1-3 nm, e.g., between 2-2.5 nm, may be provided.

In accordance with some illustrative embodiments, at least one of the third layers 105a to 105c may be nitridized in a particular manner to reduce the trap density at the substrate interface to the respective active semiconductor layer 106a to 106c to improve charge retention. For example, the nitrogen concentration in at least one of the third layers 105a to 105c may decrease rapidly towards an interface between the active semiconductor layer(s) and the third layer(s) to limit the formation of silicon nitride ($Si_3N_4$) layer in contact with the active semiconductor layer(s), as a silicon nitride layer comprising polar molecules detrimentally increases the trap density if present at the active semiconductor layer(s) (thereby reducing charge retention via trap to trap tunneling). In one particular embodiment, the nitrogen concentration may be below $5\times10^{21}$ atoms/cm$^3$ throughout the first 25% of the thickness of the third layer(s) and reaches about $5\times10^{21}$ atoms/cm$^3$ at a location about 50% of the thickness or at the centerline of the third layer(s), while possibly being above $5\times10^{21}$ atoms/cm$^3$ within the last 25% of the thickness of the third layer(s) proximate to the respective second layer(s).

In accordance with some illustrative embodiments of the present disclosure, a thickness of at least one of the first layers 103a to 103c may be greater than a thickness of the respective one(s) of the third layers 105a to 105c.

With regard to FIGS. 2a-2d, one illustrative method of forming a wafer with an SOI structure having a buried insulating multilayer structure will be described with regard to some illustrative embodiments of the present disclosure. The illustrative embodiments of the present disclosure as described with regard to FIGS. 2a-2d below allow forming a thin semiconductor material film on a buried insulating multilayer structure that is disposed on the base substrate material.

Figure 2A:
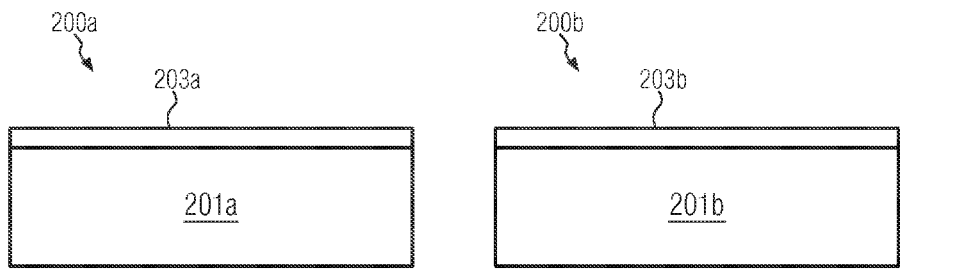
FIGS. 2a-2d schematically illustrate the formation of a wafer with SOI structure having a buried insulating multilayer structure in accordance with some illustrative embodiments of the present disclosure.

With regard to FIG. 2a, an early stage during fabrication is schematically illustrated in which a first wafer 200a and a second wafer 200b are provided. The first wafer 200a comprises a semiconductor material 201a, e.g., silicon or silicon germanium or the like, and the second wafer 200b comprises a semiconductor material 201b, e.g., silicon or silicon germanium or the like. On an upper surface of the first wafer 200a, a layer 203a of oxide material may be formed, e.g., a native silicon dioxide. On an upper surface of the second wafer 200b, a layer 203b of oxide, e.g., native silicon dioxide, may be formed. In accordance with some illustrative examples herein, each of the first and second wafers 200a and 200b may be subjected to a thermal oxidation process.

Figure 2B:
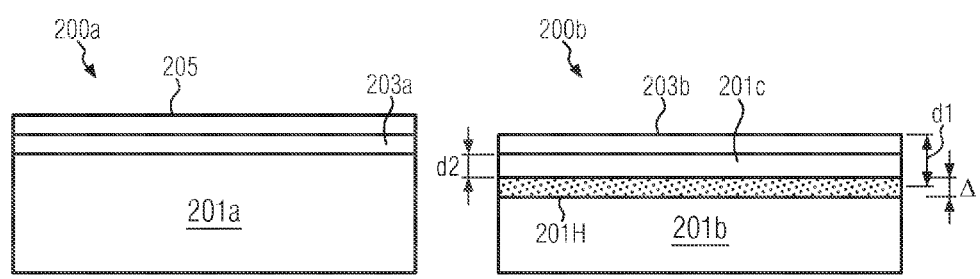

Next, as illustrated in FIG. 2b, a layer 205 of nitride material, e.g., Si$_3$N$_4$, may be formed on the layer 203a, e.g., by CVD techniques.

The second wafer 200b may be subjected to an ion implantation process, e.g., by implanting ions into the semiconductor material 201b, thereby forming a hydrogen layer region 201H in the semiconductor material 201b. The hydrogen layer region 201H may be buried into the semiconductor material 201b such that a semiconductor material layer 201c having a thickness d2 is provided on the hydrogen layer region 201H. In accordance with some illustrative examples, H$^+$ ions may be implanted at about 150 keV and a dose on the order of about $10^{16}$ cm$^{-2}$, e.g., of about $5\times10^{16}$ cm$^{-2}$, into monocrystalline silicon with a surface having a crystallographic orientation corresponding to a major crystallographic plane, e.g., a (100) plane for forming the hydrogen layer region 201H having a thickness of about 1.2 μm. However, the above examples should not be considered to impose any limitation to the present disclosure and the implantation energy may be chosen out of a range from about 10 keV (leading to a thickness of about 0.1 μm) to about 1000 keV (leading to a thickness of about 13.5 μm). For example, an implantation energy of 50 keV leads to 0.5 μm, an implantation energy of 100 keV leads to 0.9 μm, an implantation energy of 200 keV leads to 1.6 μm, and an implantation energy of 500 keV leads to 4.7 μm.

By implanting hydrogen at a dose on the order of $10^{16}$ cm$^{-2}$ into the semiconductor material 201b, the hydrogen layer region 201H is formed by gaseous micro-bubbles at a penetration depth of about d1 in the second wafer 200b. During the implantation of hydrogen, a temperature is kept below the temperature at which the gas produced by the implanted hydrogen ions can escape from the semiconductor material 201b by diffusion. In accordance with some illustrative examples herein, an implantation temperature may be between 20-400° C.

Of course, a person skilled in the art will appreciate that the hydrogen layer region 201H is disposed in the substrate 201b at the penetration depth d1±an uncertainty Δ.

Figure 2C:
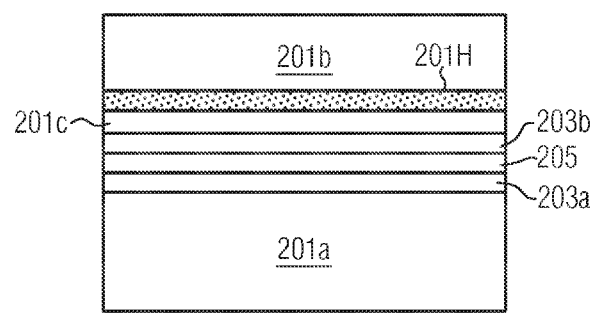

With regard to FIG. 2c, a bonded wafer arrangement 200ab is schematically illustrated, the bonded wafer arrangement 200ab being formed by bonding the first wafer 200a together with the second wafer 200b. In accordance with an illustrative example herein, an upper surface of the layer 205 may be bonded together with an upper surface of the layer 203b.

Figure 2D:
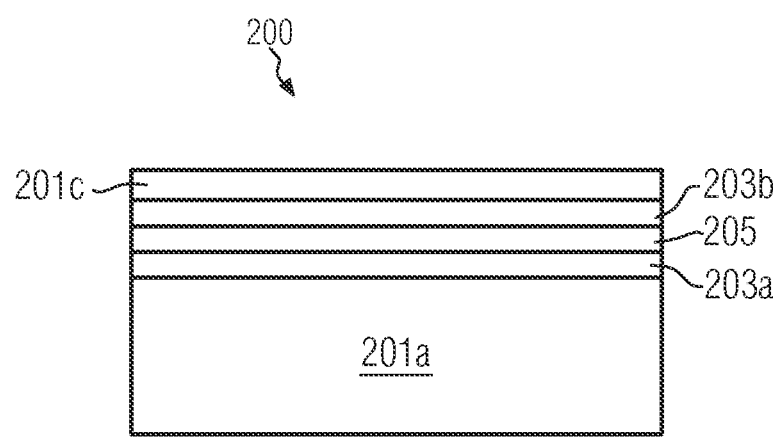

Next, as illustrated in FIG. 2d, a wafer with an SOI structure (semiconductor-on-insulator) having a buried insulating multilayer structure formed by the layers 203a, 205 and 203b may be obtained after exposing the bonded wafer arrangement 200ab of FIG. 2c to a heat treatment in which a crystalline rearrangement following the disorder created by the ion implantation occurs. The bonded wafer arrangement 200ab breaks at the hydrogen layer region 201H into two pieces, leaving a wafer 200 with an SOI structure having a buried insulating multilayer structure formed by the layers 203a, 205 and 203b. Particularly, due to the heat treatment, the semiconductor material layer 201c separates from the semiconductor material 201b due to the crystalline rearrangement and to the coalescence of bubbles present in the hydrogen layer region 201H, which produce micro-bubbles, both resulting from the heat treatment. In accordance with some illustrative examples, the heat treatment may comprise a temperature above approximately 500° C.

In accordance with some illustrative embodiments of the present disclosure, the wafer 200 as provided by the method described above with regard to FIGS. 2a-2d may be exposed to further processing, as will be explained below with regard to FIGS. 3a-3h. After a complete reading of the present application, a person skilled in the art will appreciate that the wafer 200 may be used as a starting point to produce the semiconductor device structure 100 as discussed above with regard to FIG. 1.

Figure 3A:
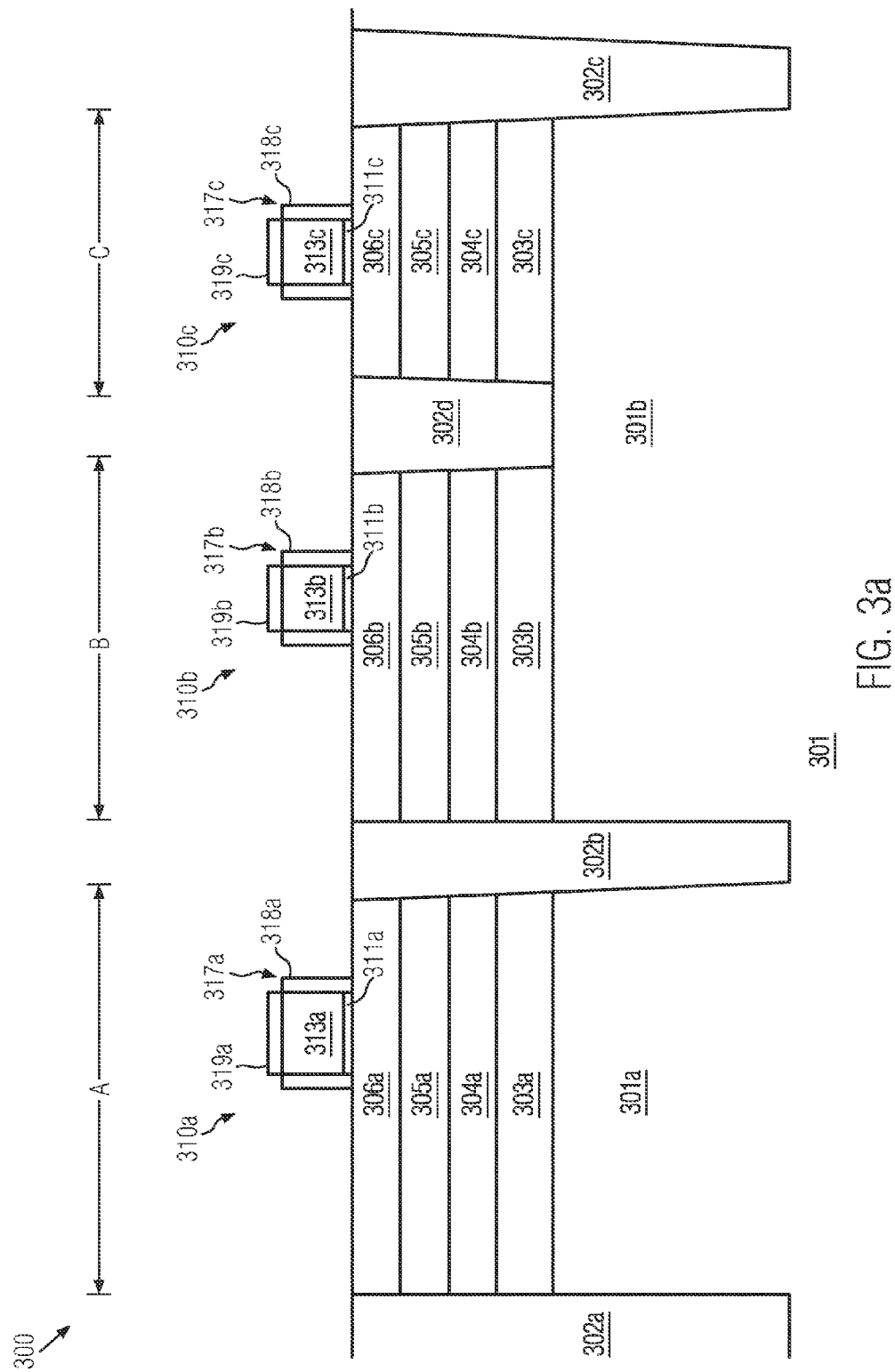
FIGS. 3a-3h schematically illustrate a process of forming a semiconductor device structure in accordance with some illustrative embodiments of the present disclosure.

With regard to FIGS. 3a-3h, one illustrative example of a process of forming a semiconductor device structure 300 will be described. As a starting point, a wafer in accordance with wafer 200 of FIG. 2d may be provided. The wafer 200 may be exposed to a process of forming STI elements 302d and isolation elements 302a, 302b and 302c. Accordingly, an upper surface of the wafer 200 of FIG. 2d may be separated into several active regions A, B and C as illustrated in FIG. 3a. Consequently, the isolation elements 302a, 302b and 302c delimit a region 301a of a base substrate material 301 from a region 301b of the base substrate material 301. After a complete reading of the present application, a person skilled in the art will appreciate that the base substrate material 301 may correspond to the semiconductor material 201a in FIG. 2d. Above the region 301b, a buried insulating multilayer structure may be separated into two buried insulating multilayer regions formed by the layers 303b, 304b and 305b, separated from the layers 303c, 304c and 305c via an STI element 302d. Accordingly, active semiconductor layer portions 306a, 306b and 306c are isolated by the isolation elements 302a, 302b and 302c and the STI element 302d. The isolation elements 302a to 302c may be formed in accordance with known STI techniques by etching trenches into the wafer 200 of FIG. 2d, and thereafter filling the trenches with an insulation material. The STI element 302d may be formed by etching a trench into the wafer 200 of FIG. 2d, the trench ending on an upper surface of the semiconductor material 201a. In contrast, the trenches formed for forming the isolation elements 302a to 302c are formed by etching deep trenches extending into the semiconductor material 201a in FIG. 2d.

After having formed the isolation elements 302a to 302c and the STI element 302d, gate structures 310a, 310b and 310c may be formed above the regions 301a and 301b by depositing gate dielectric materials and gate electrode materials, and patterning the gate stacks from the deposited gate dielectric materials and gate electric materials, thereby forming respective gate stacks 311a, 313a, 311b, 313b and 311c, 313c, and forming sidewall spacers 318a, 318b and 318c adjacent sidewalls of the gate stacks 311a, 313a to 311c, 313c. Furthermore, gate caps 319a to 319c may be formed above the upper surfaces of the gate electrode material 313a to 313c, thereby forming spacer structures 317a to 317c embedding and encapsulating the respective gate stacks 311a, 313a to 311c, 313c.

Accordingly, at the stage illustrated in FIG. 3a, a first semiconductor device A comprising the gate structure 310a, a second semiconductor device B comprising the gate structure 310b, and a third semiconductor device C comprising the gate structure 310c may be provided.

Figure 3B:
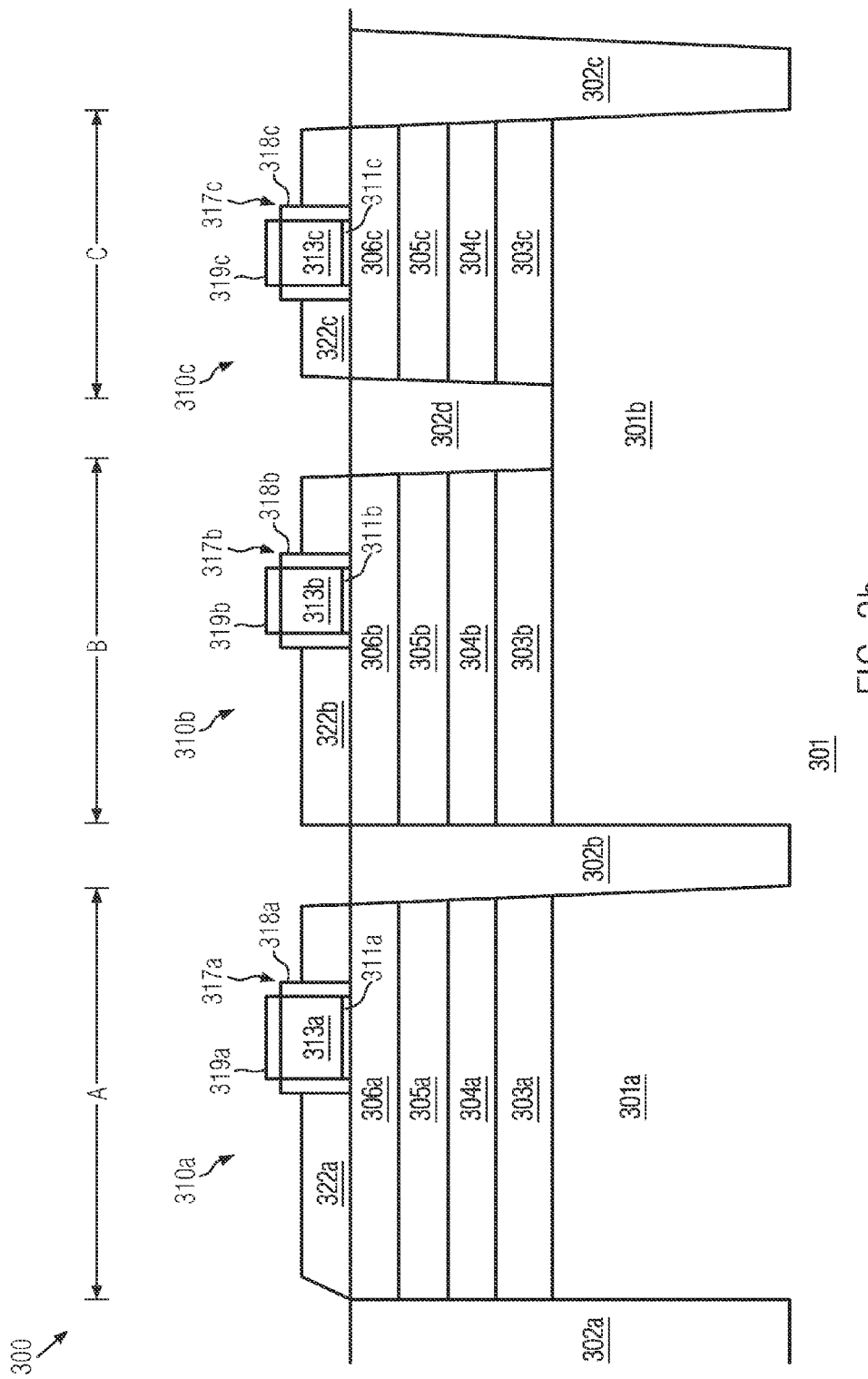

With regard to FIG. 3b, a more advanced stage during fabrication is illustrated, where an epitaxial growth process is performed for forming raised source/drain regions 322a to 322c on upper surfaces of the active semiconductor portions 306a to 306c adjacent the gate structures 310a to 310c. This does not pose any limitation to the present disclosure and formation of raised source/drain regions may be suppressed in alternative process flows.

Figure 3C:
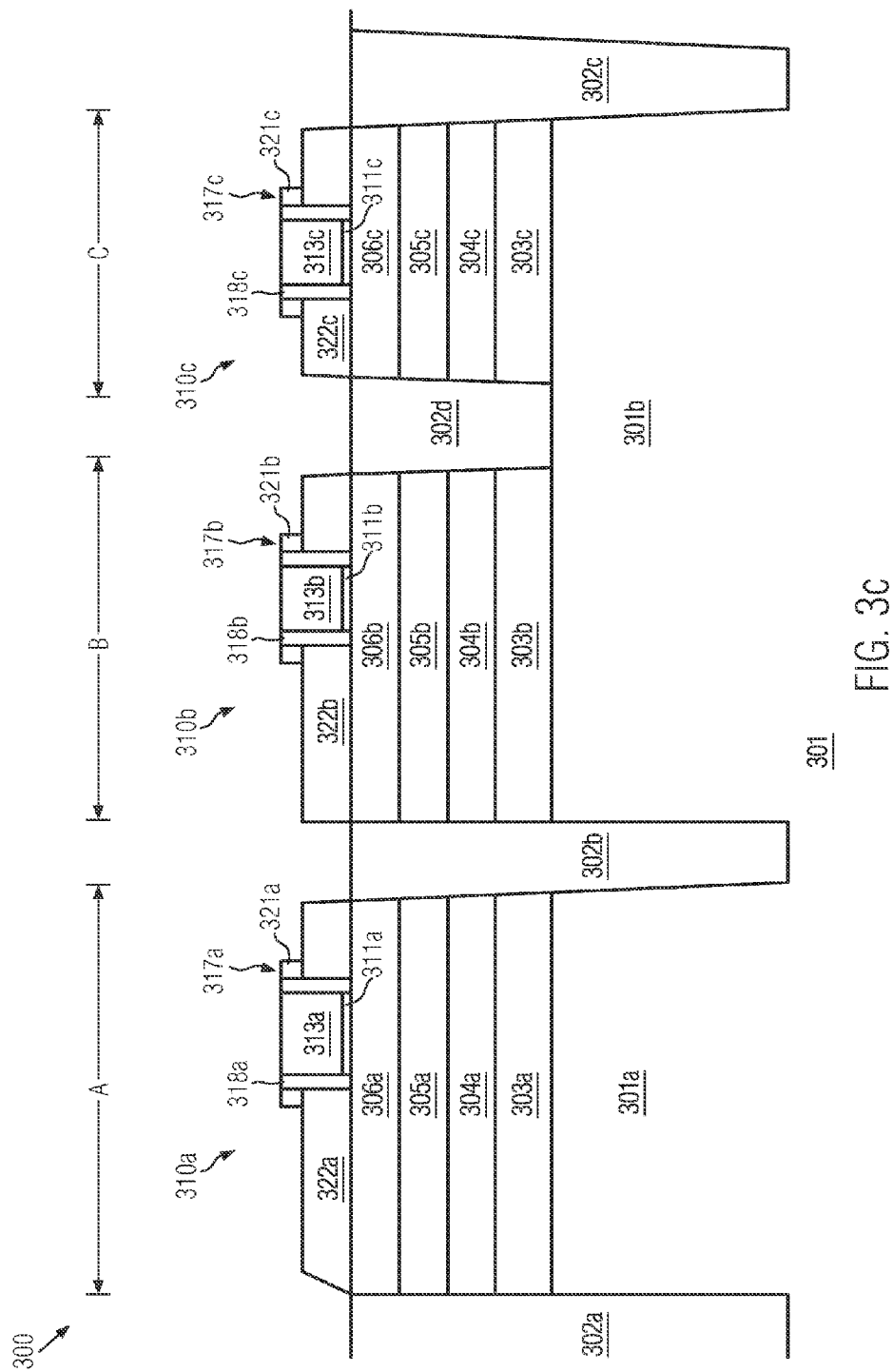

Next, as illustrated in FIG. 3c, the semiconductor device structure 300 is illustrated in a more advanced stage during fabrication, particularly after the gate caps 319a to 319c are removed and sidewall spacer extensions 321a to 321c are formed on upper portions of the sidewall spacers 318a to 318c being exposed from the raised source/drain regions 322a to 322c. In accordance with some illustrative embodiments of the present disclosure, the sidewall spacer extensions 321a to 321c may be formed by depositing an insulating material over the semiconductor device structure 300 and subsequently an anisotropic etching process, e.g., a re-etch for anisotropically etching the deposited insulating material layer (not illustrated) to expose upper surfaces of the gate electrodes 313a to 313c and the raised source/drain regions 322a to 322c. The sidewall spacer extensions 321a to 321c may be formed in order to adjust a separation between the gate structures 310a to 310c and silicide contact regions (not illustrated) to be formed in and on the raised source/drain regions 322a to 322c.

Figure 3D:
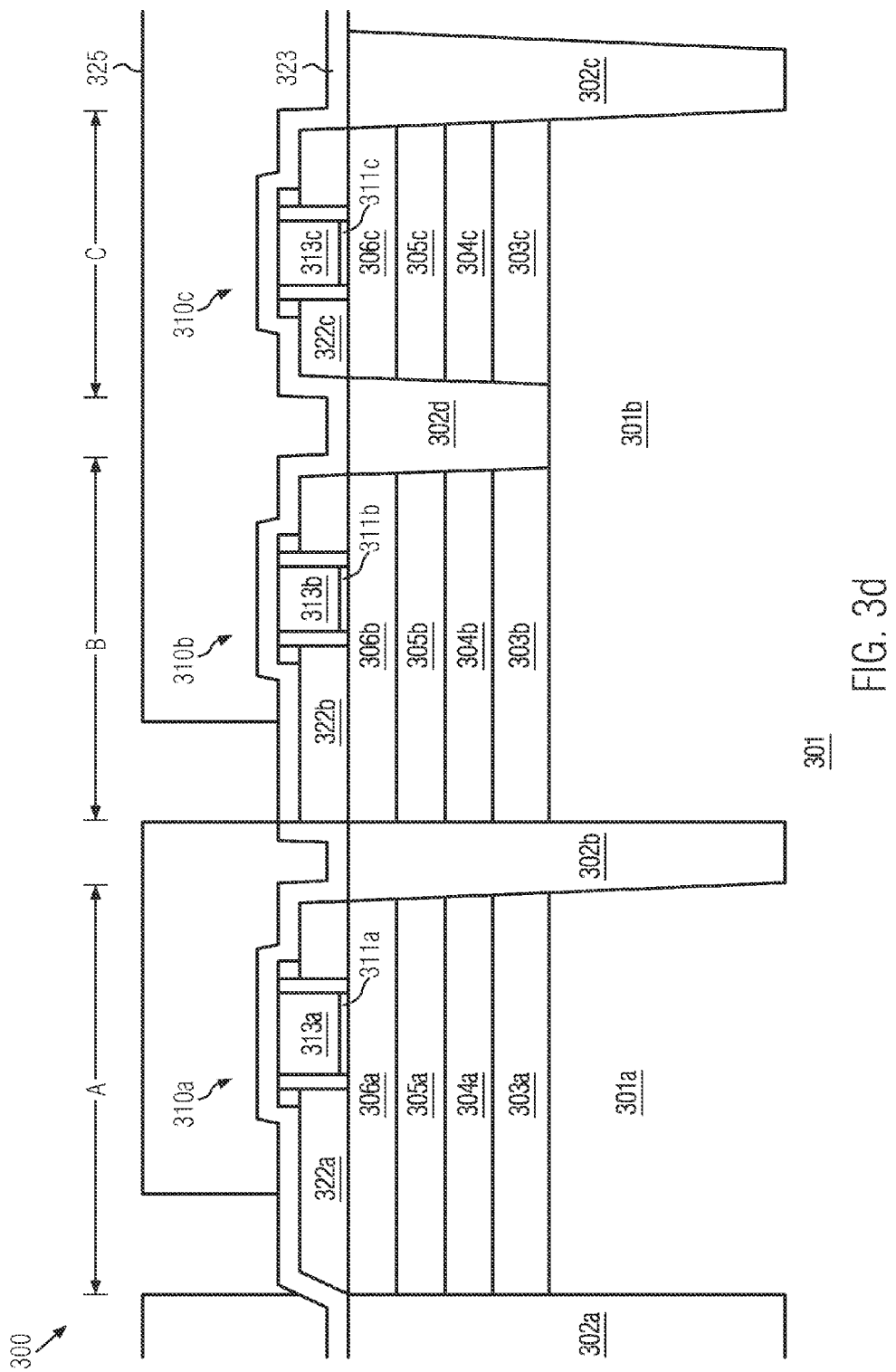

With regard to FIG. 3d, the semiconductor device structure 300 is schematically illustrated at a more advanced stage during fabrication, particularly after a patterned hard mask 323, 325 comprising an insulating material layer 323 and a patterned photoresist 325 is formed on the semiconductor device structure 300, e.g., by depositing the insulating material 323, e.g., a nitride material, and an unpatterned photoresist by spin-on techniques and photolithographically patterning the unpatterned photoresist to obtain the patterned photoresist 325.

Figure 3E:
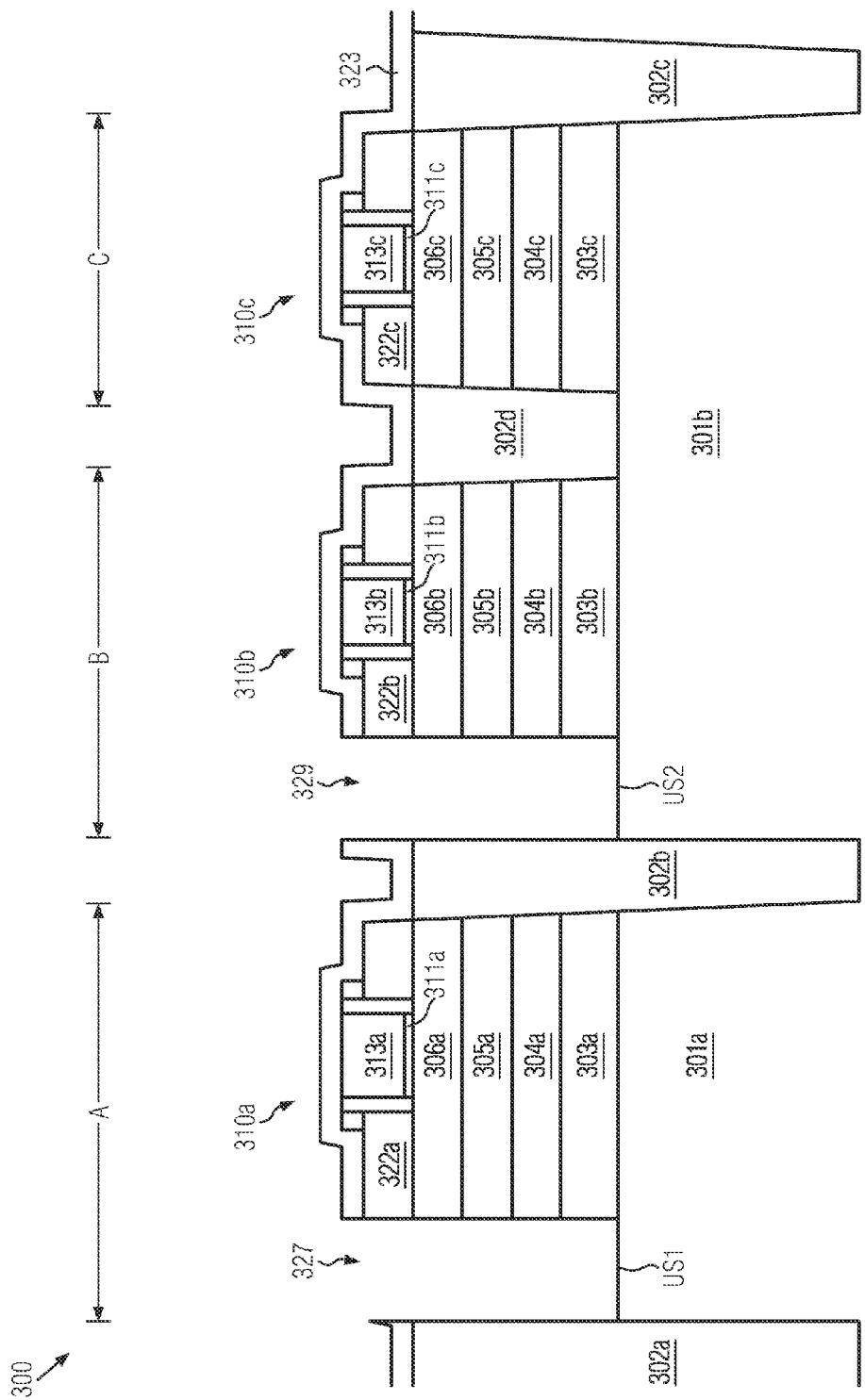

With regard to FIG. 3e, the semiconductor device structure 300 is schematically illustrated at a more advanced stage during fabrication, particularly after an etch sequence for exposing upper surface regions US1 and US2 of the regions 301a and 301b by etching trenches 327 and 329 into the first and second semiconductor devices A and B, the trenches 327 and 329 ending on the upper surfaces US1 and US2 of the regions 301a and 301b. Subsequently, the photoresist is stripped in a strip process (not illustrated).

Figure 3F:
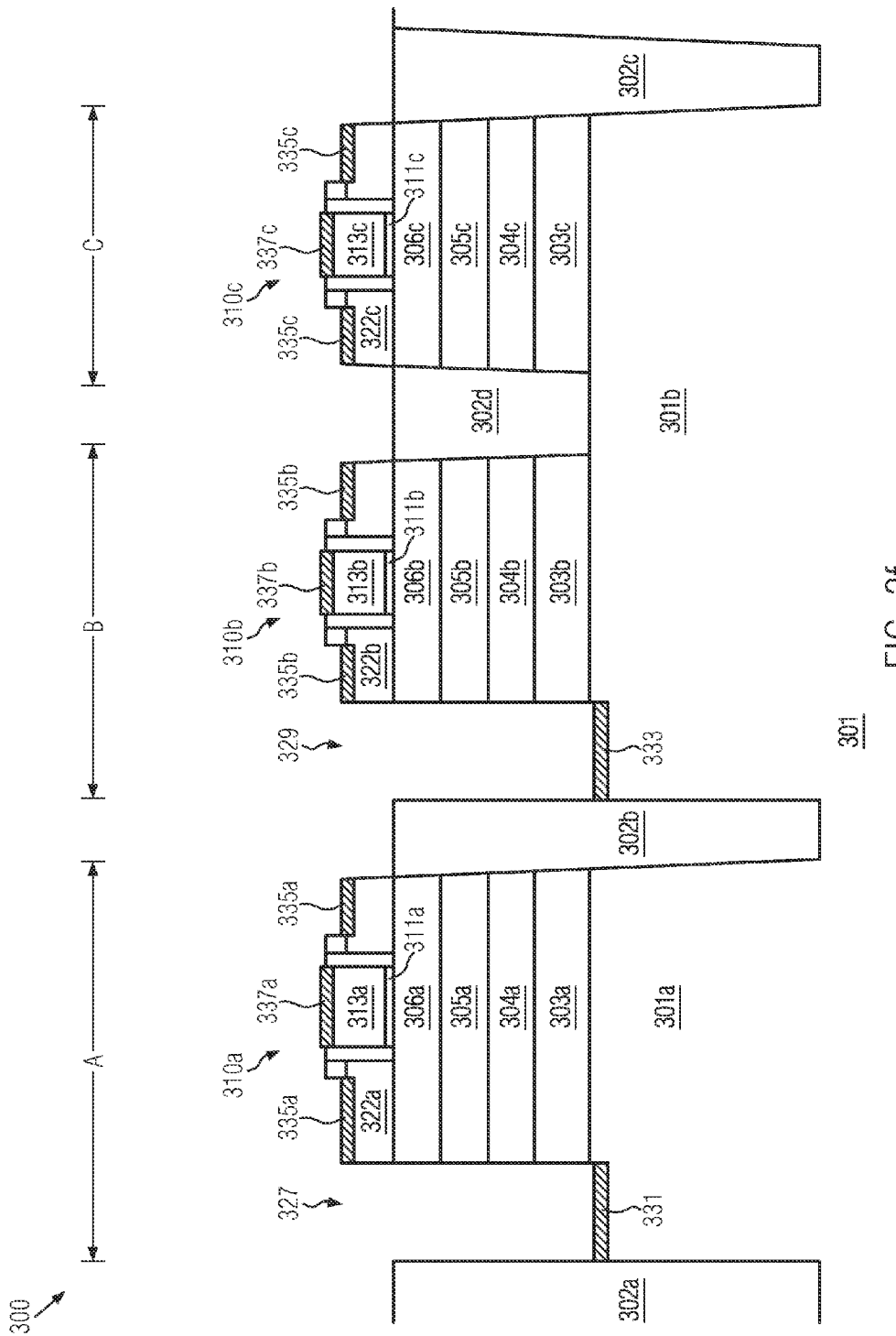

Next, as illustrated in FIG. 3f, the semiconductor device structure 300 is illustrated at a more advanced stage during fabrication, particularly after the remaining insulating material layer 323 is removed and silicide regions 331 and 333 are formed within the trenches 327 and 329. Furthermore, silicide contacts to the semiconductor devices A, B and C contacting the raised source/drain regions 322a to 322c via source/drain silicide regions 335a to 335c and gate silicide regions 337a to 337c contacting the gate electrodes 313a to 313c are formed. After a complete reading of the present application, a person skilled in the art will appreciate that the formation of the silicide regions is achieved in accordance with known silicidation and, particularly, salicidation (self-aligned silicidation) processes during which a contact metal material is deposited, subjected to an annealing process for reacting the deposited contact metal material with semiconductor material to form silicide material and subsequently removing unreacted contact metal material from insulating material surfaces via an appropriate etch chemistry.

Figure 3G:
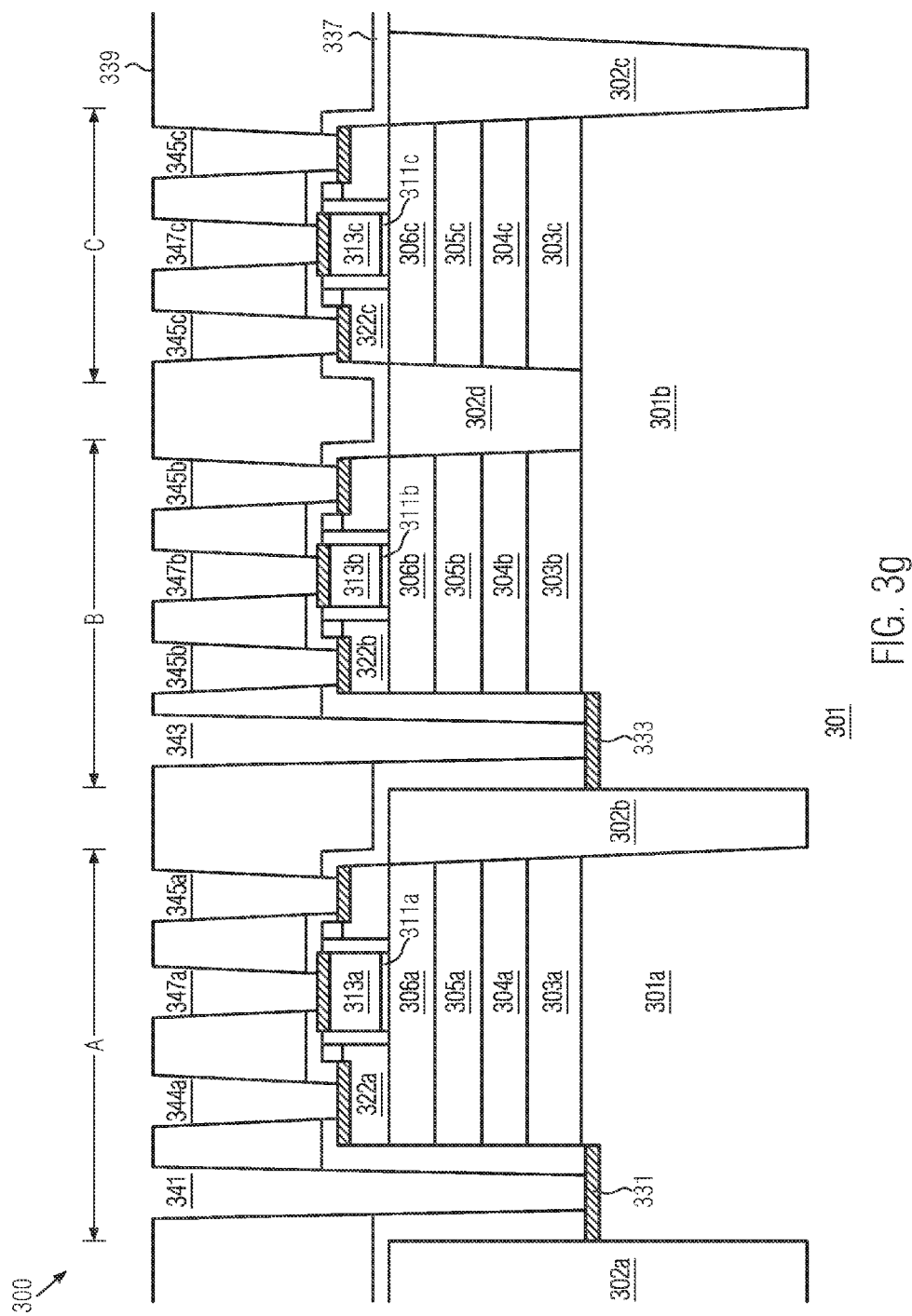

Next, as schematically illustrated in FIG. 3g, the semiconductor device structure may be exposed to a process for depositing TPEN or CPEN material 337, e.g., by CVD techniques for depositing nitride material with a predefined strain level, and by blanket-depositing a contact dielectric 339, e.g., a conventional interlayer dielectric material or a low-k material, and subsequently forming a masking pattern (not shown) over the contact dielectric 339 in accordance with a contact scheme for etching contact trenches 341, 343 to partially expose an upper surface of the silicide contact regions 331 and 333. Furthermore, contact trenches 345a to 345c partially exposing upper surfaces of the source/drain silicide regions and gate contact trenches 347a to 347c partially exposing an upper surface of the gate silicide regions may be etched in accordance with the masking pattern (not illustrated). Subsequently, the masking pattern (not illustrated) may be removed leaving the semiconductor device structure 300 as schematically illustrated in FIG. 3g.

Figure 3H:
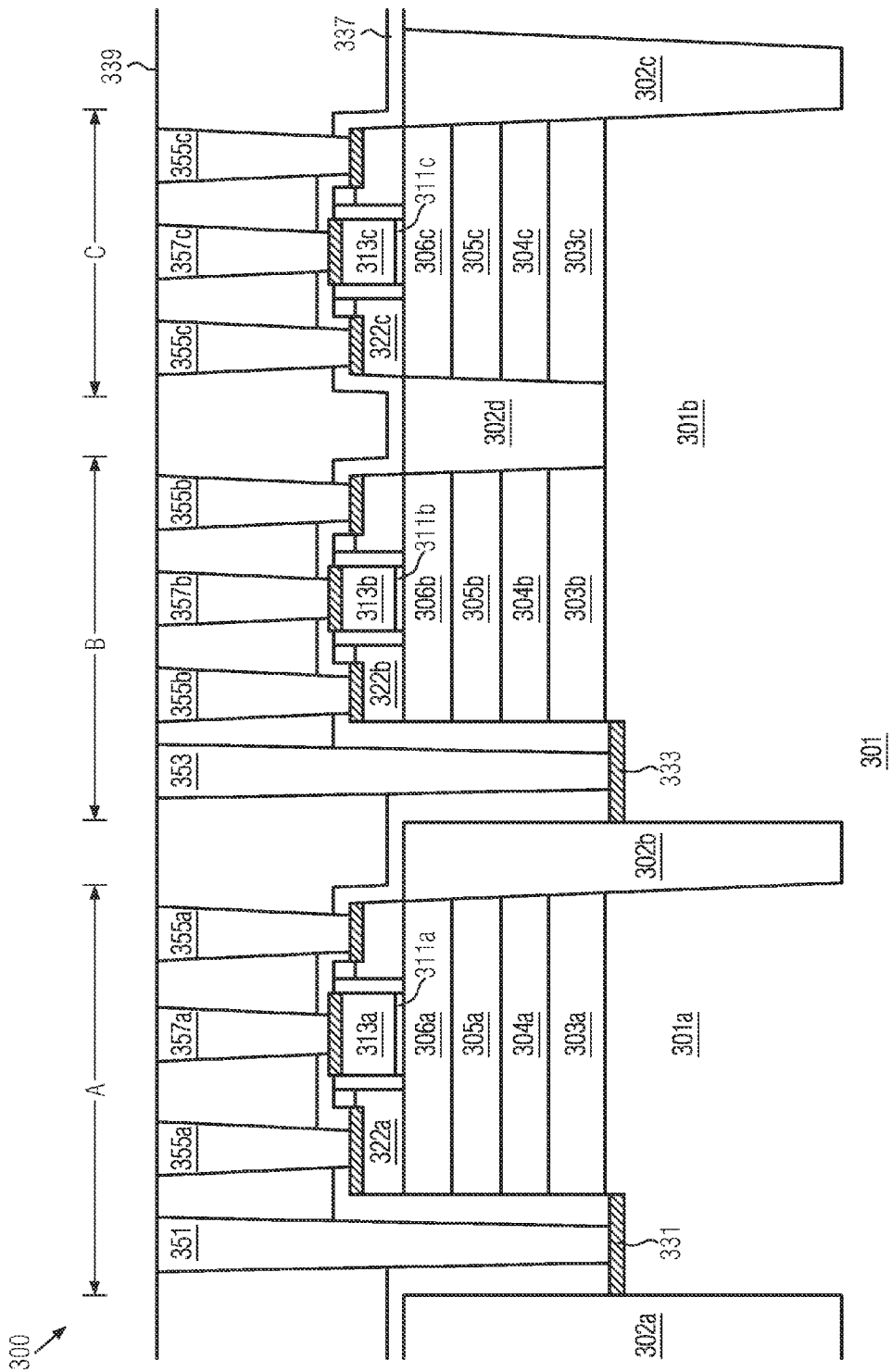

With regard to FIG. 3h, the semiconductor device structure 300 is schematically illustrated in a more advanced stage during fabrication, particularly after the trenches 341, 343, 345a to 345c and 347a to 347c are filled with a contact-forming material to form back bias contacts 351 and 353 contacting the respective back bias silicide regions 331, 333, and forming source/drain contacts 355a to 355c contacting the source/drain silicide regions, and gate contacts 357a to 357c contacting respective gate silicide regions.

After a complete reading of the present application, a person skilled in the art will appreciate that the semiconductor device structure 300 as schematically illustrated in FIG. 3h may substantially correspond to the semiconductor device structure 100 as schematically illustrated in FIG. 1 and described above. An according description of the semiconductor device structure 300 as illustrated in FIG. 3h may therefore be conducted in accordance with the explanations as provided above with regard to FIG. 1 and reference to the discussion of FIG. 1 is made for further details on the semiconductor device structure 300.

In accordance with some illustrative embodiments of the present disclosure, the threshold voltage (Vt) of the semiconductor devices A to C may be selectively flashed by applying an appropriate back bias to the back bias contacts 351 and/or 353. Furthermore, after a complete reading of the present application, a person skilled in the art will appreciate that, alternatively or additionally, back bias can be used for implementing small variations in the threshold voltage of the semiconductor devices A to C by appropriately applying a back bias to the back bias contact 351 and/or 353.

In accordance with some illustrative embodiments of the present disclosure, a voltage pulse having a peak value of one of more than about 5 V and less than about −5 V may be applied to the back bias contact 351 and/or 353 for creating a stable shift in the threshold voltage of the respective semiconductor device(s) in the semiconductor device structure 300. In accordance with some explicit examples, a voltage of an absolute value of about at most 3 V may be further applied to the back bias contact 351 and/or 353 for tuning the threshold voltage. For example, the back bias for tuning the threshold voltage may be in a range from about 0.1 V to about 3 V or in a range from about −0.1 V to about −3 V.

In accordance with some illustrative embodiments of the present disclosure, a wafer with an SOI structure having a buried insulating multilayer structure may be provided before wafer start processes at a FAB are performed (i.e., the processes described above with regard to FIGS. 3a-3h).

Of course, after a complete reading of the present application, a person skilled in the art will appreciate that semiconductor devices in accordance with various illustrative embodiments of the present disclosure may or may not be back-biased. In the case of non-back-biased semiconductor devices, a given threshold voltage (Vt) is substantially based on the gate length. In contrast, back-biased semiconductor devices may have a tunable threshold voltage on the basis of the applied back bias. Additionally or alternatively, semiconductor devices in accordance with the present disclosure may allow for a change in the threshold voltage in a non-volatile manner. For example, the threshold voltage (Vt) may be left unchanged (no flash back bias, no varying back bias is provided). Upon applying an appropriate back bias flash, i.e., a back bias voltage pulse, the threshold voltage may be shifted in a non-volatile manner. Additionally or alternatively, the back bias may be still tuned, irrespective of whether or not the semiconductor device has been flashed. Accordingly, the present disclosure allows for a non-volatile, as well as in situ tuning of the back bias of semiconductor devices via a flashing of a buried insulating multilayer structure provided below the semiconductor device.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A semiconductor device structure, comprising:
    an SOI substrate comprising a semiconductor base substrate material, a buried insulating structure formed on said base substrate material, and a semiconductor film formed on said buried insulating structure, wherein said buried insulating structure comprises a multilayer stack having a nitride layer interposed between two oxide layers;
    a semiconductor device formed in and above an active region of said SOI substrate, comprising:
        a gate structure;
        raised source/drain regions located at opposing sides of said gate structure; and
        a silicide contact region defined in said base substrate material below said semiconductor device;
    a nitride material layer disposed above said semiconductor device and at least a portion of said silicide contact region,
    a contact dielectric disposed above said nitride material layer, and
    a back bias contact at least partially disposed in said contact dielectric and being electrically connected to said silicide contact region.

2. The semiconductor device structure of claim 1, wherein said gate structure comprises a gate dielectric disposed above said SOI substrate, said gate dielectric comprising a high-k material.

3. The semiconductor device structure of claim 1, wherein said semiconductor device structure is laterally enclosed by a shallow trench isolation (STI) structure.

4. A method of forming a semiconductor device structure, the method comprising:
    providing a wafer with an SOI structure having a buried insulating multilayer structure interposed between an active semiconductor layer and a base substrate material;
    forming a gate structure above said active semiconductor layer;
    forming raised source/drain regions at opposing sides of said gate structure;
    forming a back bias contact structure for contacting said base substrate material below said gate structure, said back bias contact structure being electrically insulated from said active semiconductor layer, wherein forming said back bias contact structure comprises partially removing said active semiconductor layer and said buried insulating multilayer structure for exposing a surface region of said base substrate material adjacent to said gate structure and performing a salicidation process for forming a self-aligned silicide contact region for contacting said exposed surface region of said base substrate material;
    depositing a nitride material layer above said gate structure after forming said silicide contact region, and
    depositing a contact dielectric over said deposited nitride material layer.

5. The method of claim 4, wherein said buried insulating multilayer structure comprises a nitride material layer interposed between oxide material layers.

6. The method of claim 4, wherein depositing said nitride material layer comprises performing a chemical vapor deposition (CVD) process.

7. The method of claim 4, further comprising forming a masking pattern on said deposited contact dielectric and etching a contact trench into said contact dielectric in accordance with said masking pattern for at least partially exposing said silicide contact region and filling said contact trench with a contact forming material.

8. The method of claim 4, wherein said self-aligned silicide contact region is formed when forming a silicide gate contact region for contacting said gate structure.

9. The method of claim 4, further comprising forming a sidewall spacer extension structure on said raised source/drain regions at an upper portion of said gate structure.

10. The method of claim 9, wherein said sidewall spacer extension structure is formed by depositing one of a nitride material and an oxide material over said semiconductor device structure and anisotropically etching said deposited material so as to form said sidewall spacer extension structure.

11. The method of claim 9, wherein said gate structure comprises a gate cap formed on a gate electrode material, said gate cap being removed to expose an upper surface of said gate electrode material when said sidewall spacer extension structure is formed.

12. The method of claim 4, further comprising applying a voltage pulse having a peak value of one of more than about 5 V and less than about −5 V to said back bias contact for creating a stable shift in a threshold voltage (Vt) of a semiconductor device comprising said gate structure and said raised source/drain regions.

13. The method of claim 12, further comprising applying a voltage of an absolute value of about at most 3 V to said back bias contact for tuning said threshold voltage (Vt).

14. The method of claim 4, further comprising forming a second gate structure above said active semiconductor layer, and forming a shallow trench isolation between said gate structure and said second gate structure, wherein said shallow trench isolation extends to said base substrate material and ends on an upper surface of said base semiconductor material.

15. The method of claim 4, further comprising forming a third gate structure above said active semiconductor layer, forming a trench isolation between said gate structure and said third gate structure, wherein said shallow trench isolation extends into said base substrate material to separate a first base substrate region below said gate structure from a second substrate region below said third gate structure, and forming a second back bias contact by exposing an upper surface region of said second base substrate region and forming a silicide contact region on said exposed upper surface of said second base substrate region for contacting said second base substrate region.

* * * * *